United States Patent
Torregrosa et al.

(10) Patent No.: US 12,266,692 B2
(45) Date of Patent: Apr. 1, 2025

(54) DEVICE FOR IMPROVING THE MOBILITY OF CARRIERS IN A MOSFET CHANNEL ON SILICON CARBIDE

(71) Applicants: ION BEAM SERVICES, Peynier (FR); CNM—CSIC, Barcelona (ES)

(72) Inventors: Frank Torregrosa, Simiane (FR); Laurent Roux, Marseilles (FR); Philippe Godignon, Valldoreix (ES)

(73) Assignees: ION BEAM SERVICES, Peynier (FR); CNM—CSIC, Barcelona (ES)

( * ) Notice: Subject to any disclaimer, the term of this patent is extended or adjusted under 35 U.S.C. 154(b) by 595 days.

(21) Appl. No.: 17/276,506

(22) PCT Filed: Sep. 6, 2019

(86) PCT No.: PCT/FR2019/052055
§ 371 (c)(1),
(2) Date: Mar. 16, 2021

(87) PCT Pub. No.: WO2020/058597
PCT Pub. Date: Mar. 26, 2020

(65) Prior Publication Data
US 2021/0273056 A1 Sep. 2, 2021

(30) Foreign Application Priority Data
Sep. 17, 2018 (FR) .................................... 1800976

(51) Int. Cl.
*H01L 29/16* (2006.01)
*H01L 29/66* (2006.01)

(52) U.S. Cl.
CPC .... *H01L 29/1608* (2013.01); *H01L 29/66068* (2013.01)

(58) Field of Classification Search
CPC .............. H01L 29/66068; H01L 29/78; H01L 29/7833; H01L 29/78391; H01L 29/435;
(Continued)

(56) References Cited

U.S. PATENT DOCUMENTS 6,482,704 B1   11/2002   Amano et al.
6,639,273 B1   10/2003   Ueno
(Continued)

FOREIGN PATENT DOCUMENTS

JP   2004-111614 A   4/2004
TW   201244090 A   11/2012
(Continued)

OTHER PUBLICATIONS

Liu, Yingdi, Halfmoon, Michael R., Rittenhouse, Christine A., & Wang, Sanwu. Passivation effects of fluorine and hydrogen at the SiC-SiO2 interface. 2010, United States, p. 2, https://doi.org/10.1063/1.3527943 (Year: 2010).*
(Continued)

*Primary Examiner* — Cuong B Nguyen
*Assistant Examiner* — Anthony A Pulatov
(74) *Attorney, Agent, or Firm* — Sughrue Mion, PLLC

(57) ABSTRACT

A MOSFET device arranged on a substrate 10 having first and second heavily-doped strips 11 and 14 respectively covered by first and second contacts 13 and 15, these two strips being spaced apart by a channel 18 that also appears on the substrate 10, the channel being covered by a dielectric layer 20, itself surmounted by a third contact 21. The channel 18 incorporates a thin film 19 lightly doped with dopant atoms of a same type as the channel, at the interface with the dielectric layer 20, the dopant atoms being distributed on both sides of the interface.

17 Claims, 1 Drawing Sheet

(58) Field of Classification Search
CPC .............. H01L 29/49; H01L 29/66757; H01L 29/66765; H01L 29/66818; H01L 29/78684; H01L 29/1025–1054; H01L 29/66431; H01L 29/66462; H01L 29/778; H01L 27/0883; H01L 27/14616; H01L 21/8236; H01L 21/02378; H01L 21/02447; H01L 21/02529; H01L 31/03687; H01L 31/03765; H01L 31/0745; H01L 31/1816; H01L 31/204; H01L 2924/13091; H01L 29/16–1608; H01L 29/66439; H01L 29/66469; H01L 29/775; H01L 29/04–045; H01L 29/18–185; H01L 29/22–2206; H01L 29/36–365; H01L 27/092–0928; H01L 27/11807; H01L 27/0623; H01L 21/8238–823892; H01L 21/8249; H01L 51/057; H01L 2924/10325; H01L 2924/13061; H01L 2924/13086; H01L 2924/13088; H01L 2924/13089; B81C 2203/0728; B81C 2203/0735; B81C 2203/0742

See application file for complete search history.

(56) References Cited

U.S. PATENT DOCUMENTS

| | | | |
|---|---|---|---|
| 9,853,127 B1* | 12/2017 | Anderson | H01L 29/66666 |
| 9,997,628 B1* | 6/2018 | Tseng | H01L 27/092 |
| 2007/0215954 A1 | 9/2007 | Mouli | |
| 2009/0173949 A1 | 7/2009 | Yatsuo et al. | |
| 2010/0164016 A1* | 7/2010 | Kronholz | H01L 29/161 257/E21.409 |
| 2011/0079860 A1 | 4/2011 | Verhulst | |
| 2011/0147798 A1* | 6/2011 | Radosavljevic | H01L 29/47 257/E21.403 |
| 2012/0153502 A1 | 6/2012 | Price et al. | |
| 2013/0105905 A1 | 5/2013 | Ji et al. | |
| 2015/0084066 A1 | 3/2015 | Banerjee et al. | |
| 2015/0295059 A1 | 10/2015 | Wada | |
| 2017/0221894 A1 | 8/2017 | Liu et al. | |

FOREIGN PATENT DOCUMENTS

| | | |
|---|---|---|
| TW | 201743447 A | 12/2017 |
| WO | 97/36314 A2 | 10/1997 |
| WO | 02/052312 A1 | 7/2002 |

OTHER PUBLICATIONS

Search Report for corresponding FR 1800976, dated Jun. 4, 2019.
Search Report for corresponding TW 108132566, dated Jul. 11, 2020.
International Search Report for PCT/FR2019/052055, dated Dec. 11, 2019.
International Preliminary Report On Patentability for PCT/FR2019/052055, dated Mar. 6, 2020.
Chinese Office Action dated Aug. 26, 2024, issued for Chinese application 201980060474.6.

* cited by examiner

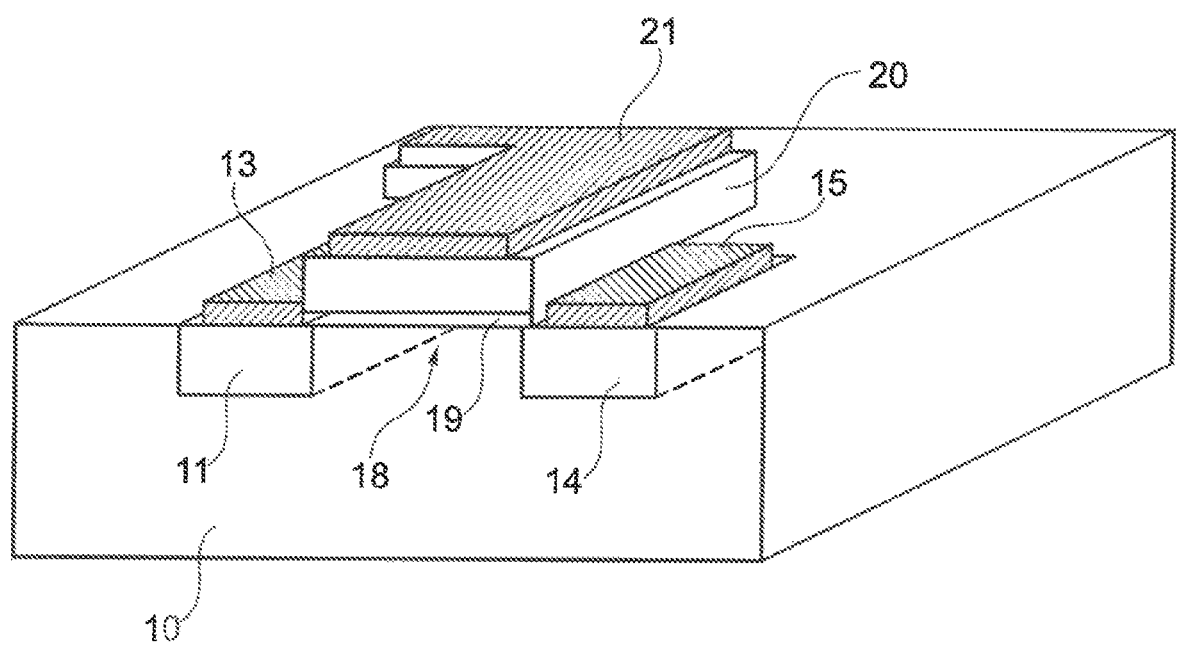

DEVICE FOR IMPROVING THE MOBILITY OF CARRIERS IN A MOSFET CHANNEL ON SILICON CARBIDE

CROSS REFERENCE TO RELATED APPLICATIONS

This application is a National Stage of International Application No. PCT/FR2019/052055 filed Sep. 6, 2019, claiming priority based on French Patent Application No. 1800976 filed Sep. 17, 2018.

The present invention relates to a device for improving the mobility of carriers in a MOSFET channel on silicon carbide.

The field of the invention is that of electronic power components made on silicon carbide (SiC), since this material presents high carrier saturation speed and very good thermal conductivity. These components include diodes, thyristors, bipolar transistors, MOSFETs, and more recently insulated gate bipolar transistors (IGBTs).

The patent U.S. Pat. No. 6,639,273 thus discloses a MOSFET device on an SiC substrate comprising a channel region 50 (p-channel region) having a low concentration of P type dopant between a source region 43 and a drain region 44, each of which is of N type (D1, column 5 lines 49 to 61, FIG. 1a). A gate insulating layer 45 is formed directly on the channel region 50.

Nevertheless, it is found that with components of MOSFET or IGBT type, the mobility of carriers in the channel is low compared with the mobility that exists in the core of the material. This gives rise to a limit on the current-carrying ability of such components. This is due to a high density of interface states between the SiC and the oxide of the $SiO_2$ gate. These interface states are due to the presence of defects such as carbon clusters or indeed defects in the interface layer under the oxide that arise at the end of the oxidation process.

In this respect, researchers and industry have developed techniques for improving the quality of the $SiO_2$/SiC interface. It is thus known to perform oxidation under nitrogen oxide NO or $N_2O$, and on this topic it is possible to refer to:

- G. Y. Chung, C. C. Tin, J. R. Williams, K. McDonald, R. K. Chanana, R. A. Weller, S. T. Pantelides, L. C. Felldman, O. X. Holland, M. K. Das, and J. W. Palmour—IEEE Electronic Device Letters 22, 176 (2001);
- R. Schorner, P. Friedrichs, D. Pstephani, S. Dimitrijev, and P. Jamet—Applied Physics Letters 80, 4253 (2002);
- L. A. Lipkin, M. K. Das, and J. W. Palmour—Material Science Forum 389-393, 985 (2002); and
- K. Shiraishi et al. —First Principle Study of $SiC/SiO_2$ Interfaces Towards Future Power Devices—International Electron Device Meeting IEDM 2014 conference proceeding.

Those techniques provide improvements, but they nevertheless remain insufficient, given the expected performance.

It is also known to perform annealing post-treatment under nitrogen or by preparing the surface of the SiC with plasma enhanced chemical vapor deposition (PECVD) treatment prior to oxidizing the gate. Reference may be made in particular to Document CN105047539 (A) entitled "Method for improving channel mobility of SiC metal-oxide-semiconductor-field-effect-transistor (MOSFET)".

Also known is the article "Phosphorous passivation of the $SiO_2$/4H—SiC interface" by Y. K. Sharma, A. C. Ahyi, T. Isaac-Smith, X. Shen, S. T. Pantelides, X. Zhu, L. C. Feldman, and J. R. Williams published in Solid-State Electronics—volume 68—February 2012—pages 103-107. That involves annealing in an atmosphere filled with $P_2O_5$ to transform the $SiO_2$ layer into phosphosilicate glass (PSG). That also improves the mobility of the carriers.

In this example, it is necessary to perform annealing, with all of the drawbacks that that entails, and it is difficult to control the quantity of phosphorus that is introduced. That leads to high levels of instability while the component is in operation.

An object of the present invention is thus to increase significantly the mobility of carriers in a MOSFET channel without presenting the above-mentioned limitations of the prior art.

According to the invention, a MOSFET device arranged on a substrate comprises first and second heavily-doped strips respectively covered by first and second contacts, these two strips being spaced apart by a channel that also appears on said substrate, said channel being covered by a dielectric layer, itself surmounted by a third contact; the device is remarkable in that a lightly-doped thin film is located at the interface between said channel and the dielectric layer, and in that the first and second strips and the thin film present a doping of a same type as the channel, opposed to a doping type of the substrate, in order to create charges that are fixed at the interface between the channel and the dielectric layer so that the carriers are repelled from the dielectric layer and from its defects.

Fixed charges are thus created just at the interface between the channel and the dielectric layer so that the carriers are repelled from the dielectric layer and from its defects.

Advantageously, the substrate is made of silicon carbide.

Preferably, the dielectric layer is made of silicon dioxide.

In a preferred embodiment, in a method for manufacturing such a MOSFET device, the thin film is made by ion implantation.

Thus, by way of example, the ion implantation is performed by plasma-immersion ion implantation.

In a first option, the substrate is of P type and said channel is of N type.

Under such circumstances, the dopant of said thin film is of N type.

For example, the dopant is phosphorus.

In a second option, the substrate is of N type and said channel is of P type.

Under such circumstances, the dopant of said thin film is of P type.

For example, the dopant of the thin film is boron.

Furthermore, the thin film is optionally doped with a dipole-effect element.

For example, the dipole-effect element is fluorine.

Preferably, in a method for manufacturing such a MOSFET device, the dipole-effect element is added by plasma-immersion ion implantation.

The present invention can be seen below in greater detail in the context of the following description of embodiments given by way of illustration and with reference to the sole accompanying FIGURE, which is a perspective diagram of a MOSFET device.

With reference to the FIGURE, the device is formed on a substrate 10, which is of type P in the present example. It may be a substrate that is solid, or that is grown epitaxially, or indeed that is grown epitaxially and doped.

On the top face of the substrate 10 there is a first strip 11 (on the left in the FIGURE) that is heavily N+ doped. This first strip is commonly called the drain. The drain has a first metal contact 13 applied thereto.

Still on the top face of the substrate 10, there is a second strip 14 (on the right in the FIGURE) that is likewise heavily N+ doped. It is arranged parallel to the first strip 11 and at a certain distance therefrom. This second strip 14 is commonly called the source. The source has a second metal contact 15 applied thereto.

The gap that lies between the drain and the source forms a channel 18.

Conventionally, in MOSFET technology, a dielectric layer is added onto the channel between the drain 11 and the source 14. In contrast, according to the invention, a lightly-doped thin film 19 is created on the channel before applying the dielectric layer.

Advantageously, this thin film 19 is made by ion implantation, in particular in plasma immersion mode, which has the advantage of generating fewer defects. It is lightly doped, e.g. with doping being performed at an acceleration voltage less than 10 kilovolts (kV) (typically in the range 2 kV to 5 kV), and the implanted dose is of the order of $10^{14}$ atoms per square centimeter (cm$^2$). The dopant is of type N, and by way of example it may be phosphorus. The plasma is preferably $PH_3$ or $PF_x$. It is also possible to adopt arsenic as the dopant, in which case the plasma would be of type $AsH_3$ or $AsF_x$.

Doping is isotropic and may cover the flanks of a trench independently of the angle made between the trench and the surface.

It is also desirable for the thin film 19 to have dipole-effect elements introduced therein, with a first choice being fluorine. Once more, these elements are introduced by plasma-immersion ion implantation.

A dielectric layer 20 is then deposited on the thin film 19 in register with the channel 18. In MOSFET terminology, this layer is commonly referred to as the gate oxide. It is usually silicon oxide made by thermal oxidation of the substrate, or by chemical vapor deposition (CVD), or by a combination of both of these techniques.

It results that the dopant of the thin film 19 is distributed on both sides of the interface with the silicon dioxide 20.

A third contact 21 is deposited on the gate oxide 20 so as to constitute the gate of the MOSFET device.

Such a configuration provides major advantages compared with the state of the art.

Firstly, the mobility of carriers in the channel under the gate is multiplied by a factor of more than 3.

Secondly, in the conductive state, the drain/source current (IDS) is increased by a factor close to 10.

Above, it is assumed that the device is implanted on a P type substrate.

It is entirely possible to apply the invention to a device implanted on an N type substrate.

Under such circumstances, the drain and the source are heavily doped by means of an element of P+ type.

Similarly, the thin film is then lightly doped with an element of P type, such as boron or aluminum.

There is no need to give more details about this second device, since the person skilled in the art can easily transpose the above description for a P type substrate to an N type substrate.

In parallel, the doping techniques are identical and any plasmas that are used form part of the state of the art, whether involving boron or indeed aluminum.

The invention is described with reference to signal-processor MOSFET devices. The invention also applies to vertical power MOSFET devices, or indeed to "trench" transistors.

The embodiments of the invention described above have been selected for their concrete natures. Nevertheless, it is not possible to list exhaustively all embodiments covered by the invention. In particular, any of the means described may be replaced by equivalent means without going beyond the ambit of the present invention.

The invention claimed is:

1. A MOSFET device arranged on a substrate comprising first and second heavily-doped strips respectively covered by first and second contacts, these two strips being spaced apart by a channel that also appears on the substrate, the channel being covered by a dielectric layer, itself surmounted by a third contact; wherein a lightly-doped thin film is located at an interface between the channel and the dielectric layer, wherein dopants of the lightly-doped thin film are distributed on the sides of the interface between the dielectric layer and the channel, and the first and second strips and the thin lightly-doped film present a doping of a same type as the channel, opposed to a doping type of the substrate, in order to create charges that are fixed at the interface between the channel and the dielectric layer so that carriers of said channel are repelled from the fixed charges and thus from the dielectric layer and from its defects.

2. The device according to claim 1, wherein the substrate is made of silicon carbide.

3. The device according to claim 1, wherein the dielectric layer is made of silicon dioxide.

4. The device according to claim 1, wherein the substratet is of P type and said channel is of N type.

5. The device according to claim 4, wherein the lightly-doped thin film is doped with an element of N type.

6. The device according to claim 5, wherein the element of N type is phosphorus.

7. The device according to claim 1, wherein the substrate is of N type and the channel is of P type.

8. The device according to claim 7, wherein said lightly-doped thin film is doped with an element of P type.

9. The device according to claim 8, wherein the element of P type is boron.

10. The device according to claim 1, wherein the lightly-doped thin film is doped with a dipole-effect element.

11. The device according to claim 10, wherein the dipole-effect element is fluorine.

12. A method for manufacturing a device according to claim 10, wherein the dipole-effect element is added by plasma-immersion ion implantation.

13. A method for manufacturing a device according to claim 1, wherein the lightly-doped thin film is made by ion implantation.

14. The method for manufacturing a device according to claim 13, wherein the ion implantation is performed by plasma-immersion ion implantation.

15. The method according to claim 14, wherein the lightly-doped thin film made by the plasma-immersion ion implantation with an acceleration voltage comprise between 2 kV and 5 kV.

16. The method according to claim 15, wherein the implanted dose is of an order of $10^{14}$ atoms per square centimeter.

17. The method according to claim 16, wherein the implanted dose is $10^{14}$ atoms per square centimeter.

\* \* \* \* \*